United States Patent [19]
Mori et al.

[11] Patent Number: 5,625,637
[45] Date of Patent: *Apr. 29, 1997

[54] SURFACE EMITTING SEMICONDUCTOR LASER AND ITS MANUFACTURING PROCESS

[75] Inventors: Katsumi Mori; Tatsuya Asaka; Hideaki Iwano, all of Suwa, Japan

[73] Assignee: Seiko Epson Corporation, Tokyo, Japan

[*] Notice: The term of this patent shall not extend beyond the expiration date of Pat. No. 5,375,133.

[21] Appl. No.: 359,964

[22] Filed: Dec. 19, 1994

Related U.S. Application Data

[63] Continuation-in-part of Ser. No. 206,104, Mar. 3, 1994, Pat. No. 5,375,133, which is a continuation of Ser. No. 952,492, Jan. 19, 1993, abandoned.

[30] Foreign Application Priority Data

Mar. 28, 1991 [JP] Japan ................................. 3-64872
Mar. 11, 1992 [JP] Japan ................................. 4-52642

[51] Int. Cl.$^6$ ..................................... H01S 3/19
[52] U.S. Cl. .................. 372/96; 372/45; 372/46
[58] Field of Search ..................... 372/96, 45, 46

[56] References Cited

U.S. PATENT DOCUMENTS

| | | | |
|---|---|---|---|
| 4,845,724 | 7/1989 | Hayakawa et al. | 372/46 |
| 5,052,016 | 9/1991 | Mahbobzadeh et al. | 372/50 |
| 5,237,581 | 8/1993 | Asada et al. | 372/96 |
| 5,375,133 | 12/1994 | Mori et al. | 372/45 |
| 5,436,922 | 7/1995 | Mori et al. | 372/45 |
| 5,537,666 | 7/1996 | Mori et al. | 372/45 |

OTHER PUBLICATIONS

Peters, M.G., "Growth of beryllium doped Al(x) Ga(1-x)As/GaAs mirrors . . . " J. Vac. Sci. Tech. B. 12(6), Nov./Dec. 1994, pp. 3075–3083.

*Primary Examiner*—Rodney B. Bovernick
*Assistant Examiner*—Yisun Song
*Attorney, Agent, or Firm*—W. Glen Johnson

[57] ABSTRACT

A surface emitting semiconductor laser, with a resonator cavity transverse to the planar extent of the deposited layers, is provided with a first reflection mirror on the substrate side composed of alternating layers comprising a first layer that is made of a Group III-V compound semiconductor and a second layer that is made of a Group III-V compound semiconductor with an energy bandgap that is larger than that of the first layer. A second reflection mirror is provided at the opposite end of the cavity adjacent to a column like resonator portion. At least the first reflection mirror comprises a distributive Bragg reflection (DBR) multiple layer mirror that has an interface region between first and second layers having a carrier concentration that is higher than that of other regions. The column like resonator portion is surrounded by a buried layer which may consist of two layers, the first layer functioning as barrier layer and the second layer functioning as a flattening layer. The first layer may be comprised of a silicon compound and the second layer may be comprised of SOG or a resin compound. The multiple layer band structure of the DBR mirror is improved, current easily flows vertically through the multiple layers and the element resistance is low. In addition, a simple and reliable method is employed to fabricate the DBR mirror and the dual buried layer, respectively, because the doping concentration is controlled through dopant gas flow control or is controlled through light and can be easily accomplished without using comparatively high temperature processing.

31 Claims, 8 Drawing Sheets

FIG._3A  TMGa FLOW AMOUNT  TIME →

FIG._3B  TMAl FLOW AMOUNT  TIME →

FIG._3C  $H_2Se$ FLOW AMOUNT  TIME →

FIG._5A CONDUCTION BAND

FIG._5B VALENCE BAND

FIG._5C CONDUCTION BAND

FIG._5D VALENCE BAND

FIG._11A   TMA FLOW AMOUNT

FIG._11B   IRRADIATION OF ULTRAVIOLET LIGHT

SURFACE EMITTING SEMICONDUCTOR LASER AND ITS MANUFACTURING PROCESS

BACKGROUND OF THE INVENTION

Related Applications

This application is a continuation-in-part of patent application Ser. No. 08/206,104, filed Mar. 3, 1994, now U.S. Pat. No. 5,375,133, issued Dec. 20, 1994, which is a continuation of patent application Ser. No. 07/952,492, filed Jan. 19, 1993 now abandoned.

Technical Field

This invention relates to surface emitting semiconductor lasers that emit laser light in a direction normal to the surface of the laser substrate and, further, relates to the manufacturing process of a surface emitting semiconductor laser.

Background Technology

Figure 14:
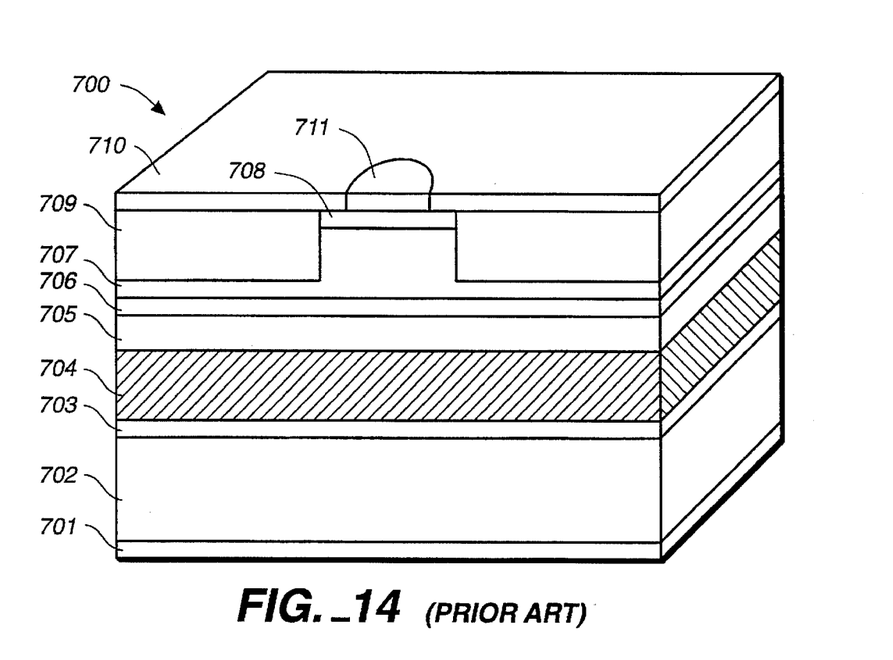
FIG. 14 is a cross sectional perspective view illustrating a previously known embodiment of a surface emitting semiconductor laser.

We have previously proposed a surface emitting semiconductor laser with a buried optical resonator employing a Group II–VI compound semiconductor materials set forth in Japanese patent application No. 2-242000. This surface emitting semiconductor laser is illustrated in FIG. 14 and comprises an n-GaAs buffer layer 703, a distributed Bragg reflection (DBR) type multiple layer mirror 704, an n-$Al_{0.4}Ga_{0.6}As$ cladding layer 705, a p-GaAs active layer 706, a p-$Al_{0.4}Ga_{0.6}As$ cladding layer 707, and a p-$Al_{0.4}Ga_{0.9}As$ contact layer 708. These layers are sequentially grown on an n-GaAs substrate 702. The p-$Al_{0.4}Ga_{0.6}As$ cladding layer 707 and the p-$Al_{0.1}Ga_{0.9}As$ contact layer 708 are selectively etched leaving a columnar shaped region. Then, a $ZnS_{0.06}Se_{0.94}$ confinement layer 709 is formed in the removed regions of these two layers around the circumference of the column shaped region. Lastly, a p-type ohmic electrode 710 and a n-type ohmic electrode 701 are deposited on the top and bottom surfaces of the laser structure. After this, multi-layer mirror 711 is deposited in a region that is slightly smaller than the diameter of the column shaped region on the surface of p-$Al_{0.1}Ga_{0.9}As$ contact layer 708.

Since $ZnS_{0.06}Se_{0.94}$ confinement layer 709, employed as a burying layer has a high resistance and low refractive index, the efficient confinement of current and light can take place, creating a high performance surface emitting semiconductor laser.

However, there are problems remaining with this technology. The flow of current in active layer 706 takes place through the DBR mirrors. The DBR mirrors have an AlGaAs layer with a large energy bandgap and a high aluminum content. Also, this layer may be comprised of alternately stacked layers of AlGaAs that have a large bandgap with a large aluminum content and a small bandgap with a low aluminum content. This results in a structural energy band that is not continuous and has high resistance rendering it difficult for the flow of current. As a result, the elemental resistance of the surface emitting semiconductor laser increases as the laser heats up through operation, resulting in inadequate reliability of the laser with an increase in the threshold current and making high speed modulation of the laser difficult.

To resolve these problems, we proposed a high concentration of dopant to the entire DBR mirror in order to reduce the laser resistance. However, this resulted in the creation of a new problem. The film quality of the layer that comprises the DBR mirror deteriorated and the laser characteristics were lost.

Tai, et al, in an article entitled "Drastic Reduction of Series Resistance in Doped Semiconductor Distributed Bragg Reflectors for Surface-Emitting Lasers", *Applied Physics Letter*, No. 56, pp. 2496–2498, Jun. 18, 1990 have attempted to resolve the same type of problem by fabricating an intermediate layer with an intermediate energy bandgap formed between the energy bandgaps of the two types of layers that form the DBR mirrors. However, when we examined this approach, the following problems were encountered:

(1) Because three or more layers with different compositions have to be sequentially formed forming a stacked DBR mirror, the manufacturing process becomes complicated, causing a reduction in yield and a lack of uniform properties.

(2) By fabricating a layer that has an intermediate bandgap, the hetero-barrier of the energy band is relieved. However, because the inclusion of this intermediate layer concurrently heightens the refractive index distribution among the DBR mirrors with the same number of layers, there is a corresponding reduction in the reflection power of the mirror with the intermediate layer. This causes a deterioration in operating properties of the laser, for example, a rise in its threshold current.

A purpose of this invention is to resolve these foregoing problems.

It is an objective of this invention to offer a surface emitting semiconductor laser that is highly efficient and reliable.

It is a further object of this invention to provide a manufacturing process for fabricating a surface emitting laser utilizing simplified manufacturing steps.

SUMMARY OF THE INVENTION

According to this invention, a surface emitting semiconductor laser emits light in a vertical direction on a substrate and comprises an optical resonator that has a pair of reflecting mirrors and at least one semiconductor layer formed between these mirrors wherein at least one of the semiconductor layers is composed of at least one column or a plurality of columns with a buried layer formed around the column shaped semiconductor layer. The buried layer may be comprised of one or more Group II–VI compound semiconductor epitaxial layers, or a combination of first and second layers each comprising a silicon compound, or a first layer comprising a silicon oxide layer or a silicon nitride layer or a silicon carbide layer, and a second layer comprising a SOG film or a resin film or a polycrystalline Group II–VI compound semiconductor film. In the case of a resin film, a heat resistant resin is preferred, such as polyimide.

This invention also comprises distributive reflection multiple layer mirrors wherein the substrate side reflection mirror contains a first layer comprising a Group III–V compound semiconductor and a second layer that has an energy bandgap that is larger than that of the first layer. In addition, the first layer and the second layer are alternately stacked, and the second layer is composed of Group III–V semiconductors with differing refractive indices. Further, the carrier concentration of the interface region between the first layer and second layer is higher than that in regions other than the interface region.

The surface emitting semiconductor laser of this invention emits light in a vertical direction utilizing an optical resonator comprising a pair of reflecting mirrors and at least one semiconductor layer formed between these mirrors, and wherein at least one of the semiconductor layers comprises at least one column or a plurality of columns. This invention also comprises a preferred buried layer or combination of layers that are formed around the columnar shaped semiconductor layer and distributive reflection multiple layer mirrors wherein among the employed reflection mirrors, the substrate side reflection mirror has a first layer that comprises a Group III–V compound semiconductor and a second layer that has an energy bandgap that is larger than that of the first layer. In this invention, the first layer and the second layer are alternately stacked with the second layer comprising Group III–V semiconductors having differing refractive indices.

The surface reflection mirrors may comprise a third layer of a Group III–V compound semiconductor and a fourth layer of a Group III–V compound semiconductor having an energy bandgap larger than that of the third layer. The third layer and fourth layers are alternately stacked and the fourth layer is composed of Group III–V semiconductors with differing refractive indices. The carrier concentration of the interface region between the third layer and fourth layer is higher than in other regions. In addition, the carrier concentration of the interface region between the third layer fourth layer also is higher than that of other regions.

In the surface emitting semiconductor laser of this invention, the first layer and third layer employ the same Group III–V compound semiconductor and the second layer and fourth layer employ the same Group III–V compound semiconductor. The maximum value of the carrier concentration of the interface region of the surface emitting semiconductor laser of this invention will be a minimum of 1.1 times and within 100 times the value of the regions of the laser, other than the interface region. The maximum value of the carrier concentration of the interface region has a value that is $5 \times 10^{20}$ cm$^{-3}$ or less. The thickness of the interface region is within $\frac{1}{3}$ of the sum of the thicknesses of the first layer and second layer, or the thickness of the interface region is within $\frac{1}{3}$ of the sum of the thicknesses of the third layer and fourth layer. The dopants employed for the n-type doping of the interface region are S, Se, Te and Si and the dopants employed for the p-type doping of the aforesaid interface region are Zn, C, Be, Mg and Ca.

This invention relates to a manufacturing process for a surface emitting semiconductor laser of the type wherein light is projected in a vertical direction on a substrate and comprises the use of a metal-organic chemical vapor deposition method or a molecular beam epitaxial growth method for forming the pair of reflection mirrors as well as at least one semiconductor layer that is formed between these mirrors for fabricating an optical resonator on a semiconductor substrate comprising a semiconductor or dielectric material. The process also includes the formation of a photoresist mask on the semiconductor layers and selectively etching at least one of the layers to form either one column or a plurality of columns followed by the formation of a one or two layers around the formed columnar shaped semiconductor layer to form a buried region.

In the manufacturing process of this invention, among the formed reflection mirrors, the substrate side reflection mirror comprises a first layer of a Group III–V compound semiconductor and a second layer that has an energy bandgap that is larger than that of the first layer. The first layer and second layer are alternately stacked, and the second layer comprises a Group III–V semiconductor with differing refractive indices. When growing at least one of the interface region of the first layer and second layer, the carrier concentration of the interface region is increased so that it is higher than that of the other interface regions by increasing the amount of doping of the interface region.

The manufacturing process for the surface emitting semiconductor laser of this invention comprises the use of a metal-organic chemical vapor deposition method or a molecular beam epitaxial growth method for forming a pair of reflection mirrors and employs at least one semiconductor layer formed therebetween for forming an optical resonator on a substrate comprising a semiconductor or dielectric material. This process further includes the formation of a photoresist mask on these semiconductor layers and the selective etching of at least one of the semiconductor layers to form either one column or a plurality of columns followed by the formation of a Group II–VI compound semiconductor region around the formed columnar shaped semiconductor layer to form a buried region. Among the formed reflection mirrors, the substrate side reflection mirror comprises a first layer of a Group III–V compound semiconductor and a second layer that has an energy bandgap that is larger than that of the first layer. The first layer and the second layer are alternately stacked, and the second layer comprises a Group III–V semiconductors with differing refractive indices. The surface side reflection mirror has a third layer comprising Group III–V compound semiconductor and a fourth layer comprising a Group III–V compound semiconductor in which the bandgap is larger than that of the third layer. The third and fourth layers are alternately stacked, and the fourth layer is formed of Group III–V semiconductor materials having differing refractive indices.

When growing at least one of the interface regions of the first and second layers and when growing at least one of the interface regions of the third and fourth layers, the carrier concentration of the interface region is increased so that it is higher than that of other regions by increasing the amount of the dopant on the interface surfaces of the third and fourth layers. The amount of the material employed for doping in the interface region and the amount of the material employed for doping in regions other than the interface region are instantaneously changed. The amount of material for doping the interface region and the amount of the material used for doping in regions other than the interface region are linearly changed or changed as a quadratic function or changed as a cubic function within $\frac{1}{2}$ the time required for doping the interface region.

The manufacturing process for the surface emitting semiconductor laser of this invention comprises the use of a metal-organic chemical vapor deposition method or a molecular beam epitaxial growth method for forming a pair of reflection mirrors and employs at least one semiconductor layer formed therebetween for forming an optical resonator on a substrate comprising a semiconductor or dielectric material. This process further includes the formation of a photoresist mask on these semiconductor layers and the selective etching of at least one of the semiconductor layers to form either one column or a plurality of columns followed by the formation of a Group II–VI compound semiconductor region around the formed columnar shaped semiconductor layer to form a buried region. Among the formed reflection mirrors, the substrate side reflection mirror comprises a first layer of a Group III–V compound semiconductor and a second layer that has an energy bandgap that is larger than that of the first layer. The first layer and the second layer are alternately stacked, and the second layer comprises a Group III–V semiconductors with differing refractive indices. When growing the interface region of at least one layer formed between the first and second layer, the carrier concentration of the interface region is increased through the exposure to light so that its carrier concentration is higher than regions other than the interface region.

The manufacturing process for the surface emitting semiconductor laser of this invention comprises the use of a metal-organic chemical vapor deposition method or a molecular beam epitaxial growth method for forming a pair of reflection mirrors and employs at least one semiconductor layer formed therebetween for forming an optical resonator on a substrate comprising a semiconductor or dielectric material. This process further includes the formation of a photoresist mask on these semiconductor layers and the selective etching of at least one of the semiconductor layers to form either one column or a plurality of columns followed by the formation of a insulating layer or layers around the formed columnar shaped semiconductor layer to form a buried region. Among the formed reflection mirrors, the substrate side reflection mirror comprises a first layer of a Group III–V compound semiconductor and a second layer that has an energy bandgap that is larger than that of the first layer. The first layer and the second layer are alternately stacked, and the second layer comprises a Group III–V semiconductors with differing refractive indices. In addition, the surface side reflection mirror is made through the alternate stacking of the third layer, which is made of a Group III–V compound semiconductor, and the fourth layer, which has an energy bandgap that is larger than that of the third layer and also is made of Group III–V compound semiconductors with differing refractive indices. Further, when the interface region of at least one of the semiconductor layers is grown, i.e., either the first layer or the second layer, the carrier concentration of the interface region is increased to be higher than that of regions other than the interface region by means of the exposure to light. A preferred dopant material for forming the carrier concentration is tetra methyl silane, which is employed when growing the reflection mirrors.

When increasing the carrier concentration of the interface region, it is desirable to concurrently change the supplied volume of the Group III material and the Group V material. This will allow for the formation of a hetero-interface between the first layer and the second layer forming the multiple layers of the distributive reflection multiple layer mirrors. It will also allow the formation of high carrier concentration areas on the hetero-interface between the third layer and the fourth layer. This will improve the non-continuous band structure by increasing the tunnel conductance of the electrons and holes allowing for the formation of a distributive reflection multiple layer mirror with extremely low resistance with no major change in the refractive index distribution. As a result, there will be no reduction in the reflection power of the mirror. Also, the overall laser resistance will drop providing a surface emitting semiconductor laser with low heat, highspeed operation and high reliability.

In addition, employing the manufacturing process of this invention, the dopant material may be temporarily increased, light may be temporarily placed on the growth surface, the Group V material and the Group III material may be temporarily changed and the carrier concentration may be increased in selected areas of the interface region or regions. The carrying out the operational steps of the methods are extremely simple and the manufacturing process takes place in a stable manner with good repeatability.

Other objects and attainments together with a fuller understanding of the invention will become apparent and appreciated by referring to the following description and claims taken in conjunction with the accompanying drawings.

BRIEF DESCRIPTION OF THE DRAWINGS

FIGS. 5A–5D graphically illustrate the conductive and valence bands of the DBR multiple layer mirror relative to the semiconductor laser embodiment of FIG. 1.

DESCRIPTION OF THE PREFERRED EMBODIMENTS

Reference is now made to a detail description of four representative embodiments comprising this invention.

[First Embodiment]

Figure 1:
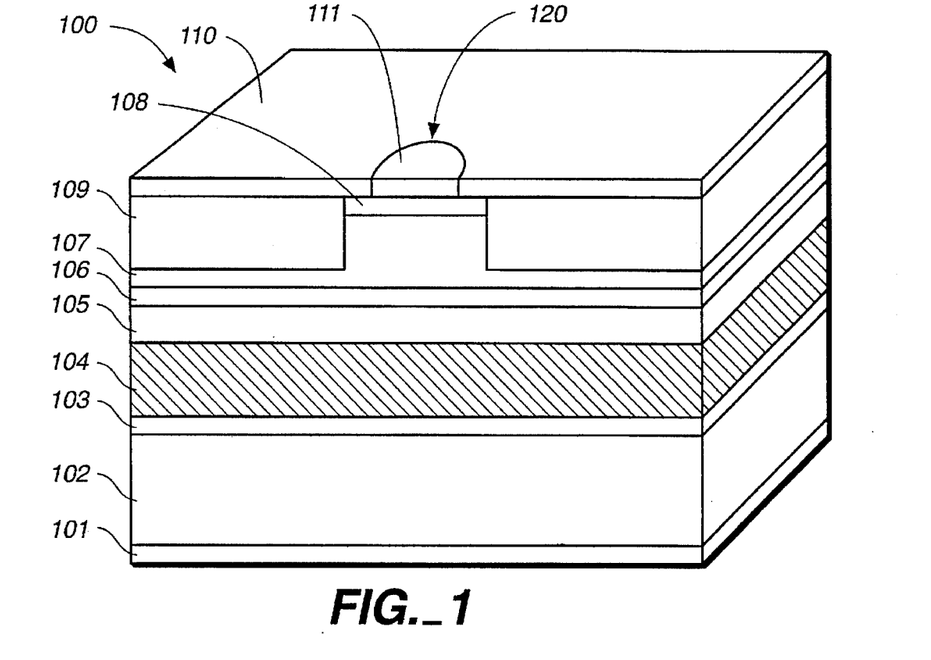
FIG. 1 is a cross sectional perspective view illustrating a first embodiment of a surface emitting semiconductor laser comprising this invention.

FIG. 1 illustrates a cross sectional view of semiconductor laser 100 comprising the first embodiment of this invention. FIGS. 2A–2E illustrate in cross section the steps in the manufacturing process of the semiconductor laser 100. In this connection, FIGS. 2A–2E are employed to describe the construction of and manufacturing process for semiconductor laser 100.

Figure 2A:
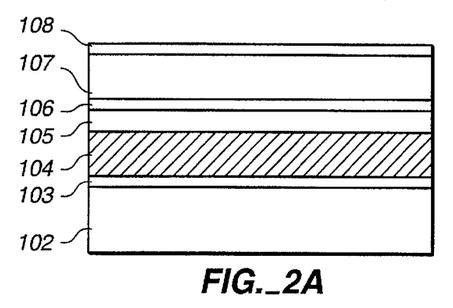
FIGS. 2A–2E show various cross sectional views of the first semiconductor laser embodiment of FIG. 1 illustrating the manufacturing process for the laser.
Figure 2B:
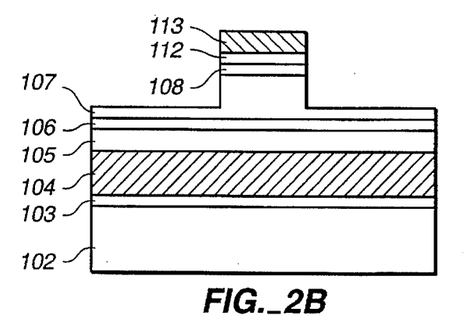

(1) First, a n-GaAs buffer layer 103 is formed on a n-GaAs substrate 102. Next, 30 pairs of distributed Bragg reflection (DBR) multiple mirror layers 104, comprising alternating layers of n-$Al_{0.7}Ga_{0.3}As$ layer and n-$Al_{0.1}Ga_{0.9}As$, are formed and have a reflection power of 98% or higher relative to light generated in the 870 nm wavelength region. Next, sequentially formed are a n-$Al_{0.4}Ga_{0.6}As$ cladding layer 105, a p-GaAs active layer 106, a n-type $Al_{0.4}Ga_{0.6}As$ cladding layer 107 and a p-$Al_{0.1}Ga_{0.9}As$ contact layer 108 by means of epitaxial growth employing MOCVD (FIG. 2A). In this embodiment, the epitaxial growth temperature is 700° C., the epitaxial growth pressure is 150 Torr, and the Group III materials employed are organic metals TMGa (tri methyl gallium) and TMAl (tri methyl aluminum). The Group V materials comprise $AsH_3$, the n-type dopant is $H_2Se$ and the p-type dopant is DEZn (diethyl zinc).

Figure 3A:
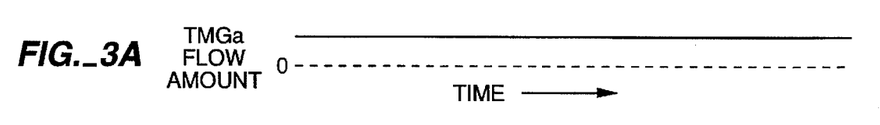
FIGS. 3A, 3B, and 3C collectively show a timing chart illustrating the changes in the flow rates for TMGa, TMAl and H$_2$Se in growing the DBR multiple layer mirror of the semiconductor laser of FIG. 1.
Figure 3B:
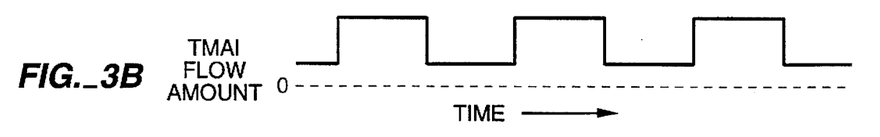
Figure 3C:
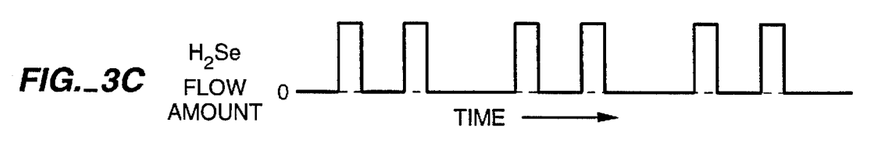

Reference is now made to the manufacturing process steps for DBR multiple layer mirror 104. FIGS. 3A–3C illustrate the changes in flow rates of TMGa and TMAl, which are the materials employed when growing the distributed reflection multiple layer mirrors, and the n-type dopant. Because the flow of TMGa is supplied at a constant rate, the area with the higher TMAl flow rate forms the n-$Al_{0.7}Ga_{0.3}As$ layer and the lower TMAl flow rate forms the n-$Al_{0.1}Ga_{0.9}As$ layer. Here, the thickness of each layer is controlled so that ¼ of the wavelength of the 870 nm wavelength light propagates through the layer. In addition, at the same time, the high flow rate $H_2Se$ section shows the growth potion in which the high concentration doping of the n-type carrier is desired, and the low flow rate $H_2Se$ section shows the growth portion in which the low concentration doping of the n-type carrier is desired. Relative to the necessary changes to gas flow rates in the MOCVD apparatus, the control of the amount of doping takes place at the desired interface by changing the high flow rate lines and low flow rate lines of the $H_2Se$ flow through the employment of a computer controlled valve. In addition, in this embodiment, the highly $H_2Se$-doped section, i.e., in the interface region between the n-$Al_{0.1}Ga_{0.9}As$ layer and the n-$Al_{0.7}Ga_{0.3}As$ layer, is such that the impurity concentration rises steeply relative to the TMAl high growth section.

(2) After the growing of the epitaxial layers 103–108, $SiO_2$ layer 112 is formed on the laser surface by means of thermal CVD. The columnar shaped portion is formed by covering a portion of layer 112 with photoresist 113 and partial, selective etching of the p-$Al_{0.4}Ga_{0.6}As$ cladding layer 107 takes place leaving the columnar shaped portion shown in FIG. 2B. The etching gas employed may be comprised of a mixture of chlorine and argon gases. The gas pressure may be $1 \times 10^{-3}$ Torr and the extraction voltage may be 400 volts. The purpose for p-$Al_{0.4}Ga_{0.6}As$ cladding layer 107 being partially etched is to provide a rib waveguide structure for carrier and light confinement in active layer 106.

Figure 2C:
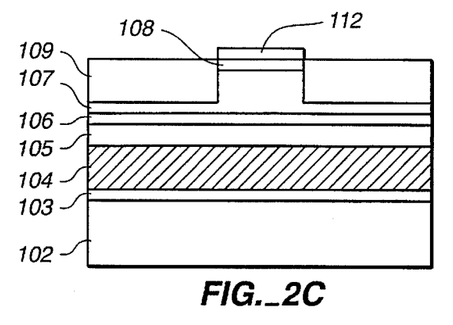

(3) Next, a burying layer is formed on the remaining portion of the p-$Al_{0.4}Ga_{0.6}As$ cladding layer 107. For this purpose, in this embodiment, photoresist layer 113 is first removed and then a $ZnS_{0.06}Se_{0.94}$ layer 109 is formed employing either MBE or MOCVD.

Figure 2D:
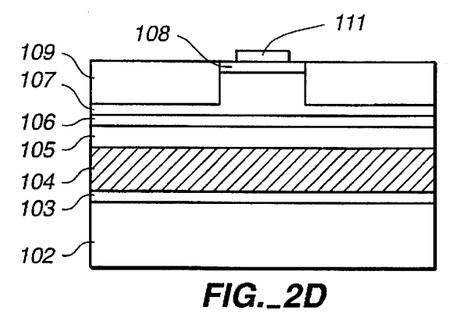

(4) After this, $SiO_2$ layer 112 is removed and four pairs of $SiO_2$/a-Si dielectric multiple layer mirrors are formed employing electron beam deposition. Dry etching, employing reactive ion etching method (RIE), is employed to remove a region slightly smaller than the diameter of the emitting section (FIG. 2D). The reflection power of the dielectric multiple layer mirrors is 94% at a wavelength of 870 nm.

Figure 2E:
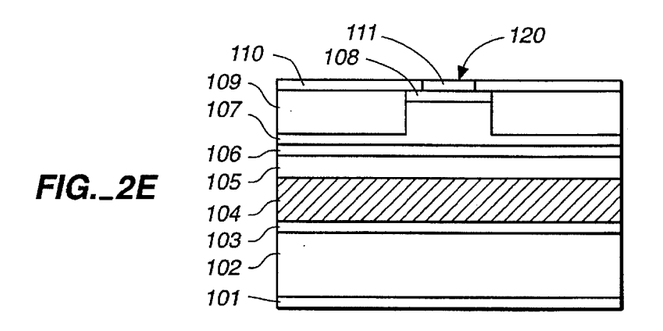

(5) Next, a p-type ohmic electrode 110 is deposited on surfaces other than the dielectric multiple layer mirrors 112 and a n-type ohmic electrode 101 is deposited on GaAs substrate 102 (FIG. 2E). Finally, alloying of these electrodes takes place in an $N_2$ atmosphere at 400° C.

Surface emitting semiconductor laser 100 of this embodiment employs a $ZnS_{0.06}Se_{0.94}$ layer as a burying layer. This layer has a resistance value of one giga ohm or higher. An extremely effective current constriction can be achieved because there is no leakage of applied current to burying layer 109. In addition, because burying layer 109 is not required to have a multiple layer structure, it can be grown easily and provides for a high level of repeatability in production.

Because surface emitting semiconductor laser 100 has a rib waveguide structure, there is an increase in the refractive index of active layer 106 at the bottom of the $ZnS_{0.06}Se_{0.94}$ layer and that of active layer 106 within the resonator sector thereby simultaneously providing an effective light waveguide.

Figure 4:
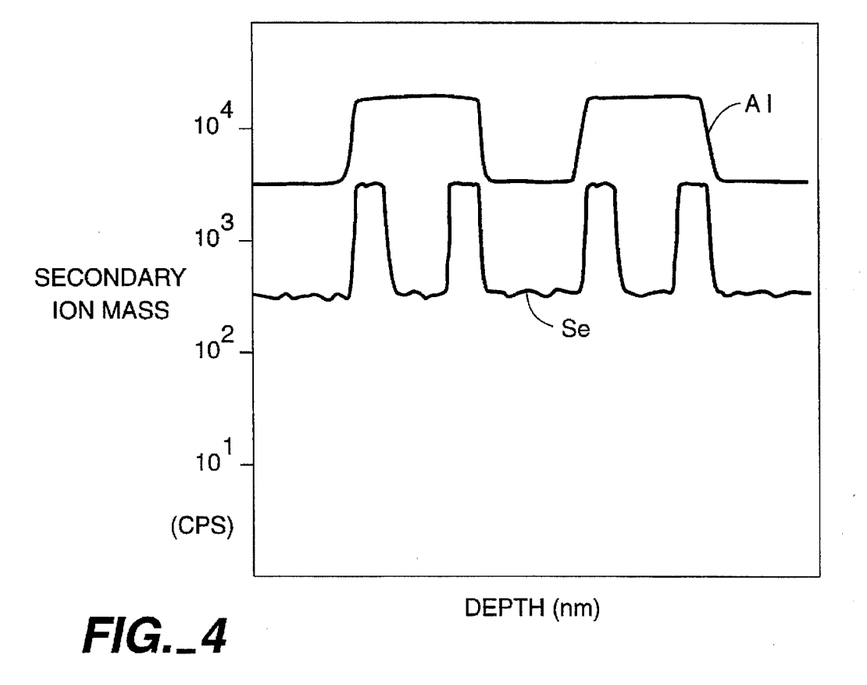
FIG. 4 is a graphic illustration of the results obtained by the use of SIMS for the purposes of evaluating a portion of the distributed reflection multiple layer mirror of the semiconductor laser embodiment of FIG. 1.

Here, the results of the evaluation of a portion of the DBR multiple layer mirrors 111 employing the SIMS are shown in FIG. 4. In FIG. 4, the vertical coordinate indicates the number of secondary ions of Al and Se. They correspond to the volume of atoms and number of carriers contained in the layer. The horizontal coordinate indicates the depth of the film thickness in a portion of the DBR multiple layer mirrors 111. Upon comparison of FIG. 4 with FIG. 3, the concentration of Se, which is an n-type dopant, will increase sharply at the interface region of the n-$Al_{0.1}Ga_{0.9}As$ layer within the n-$Al_{0.7}Ga_{0.3}As$ layer, confirming that the desired amount of doping at this point has taken place.

Figure 5A:
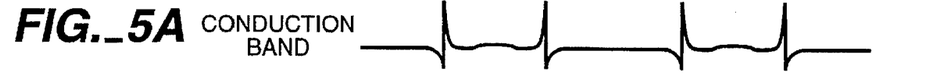
FIG. 5A illustrates the bands when the concentration of Se is sharply increased in the interface region of a n-type $Al_{0.1}Ga_{0.9}As$ layer within a n-type $Al_{0.7}Ga_{0.3}As$ layer.
Figure 5B:
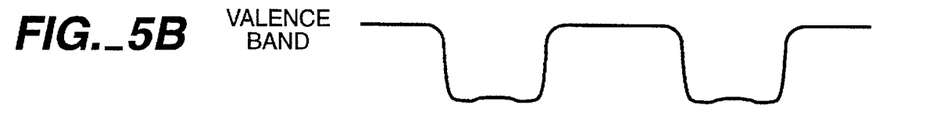
FIG. 5B illustrates the bands when generated by supplying a constant amount of Se without regard to composition.
Figure 5C:
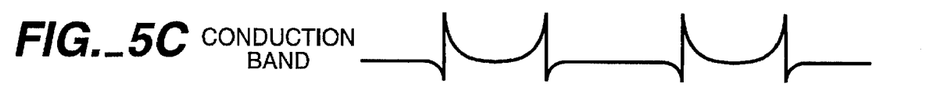
Figure 5D:
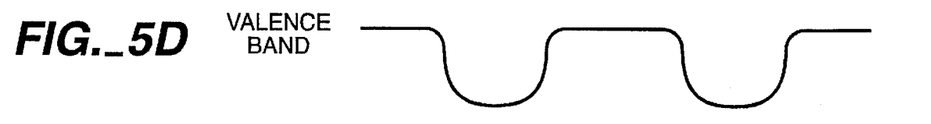

The effectiveness of this invention is illustrated in the typical energy bands in FIGS. 5A–5D for DBR multiple layer mirror 111. FIGS. 5A and 5B illustrate the case in which the concentration of the Se that was generated by means of this embodiment sharply increasing the carrier concentration at the interface region between the n-$Al_{0.1}Ga_{0.9}As$ layer and the n-$Al_{0.7}Ga_{0.3}As$ layer. FIGS. 5C and 5B illustrate the case in which Se was generated and supplied in a constant volume in a low concentration, regardless of composition. When both illustrations are compared, the walls of the conduction band become thin and the electrons are easily prone to tunnel through the conduction band as a result of the increased carrier concentration in the interface region. Thus, it is understood that the resistance in the vertical direction will decrease in the multiple film layers.

In addition, because the only place where the carrier concentration has been increased by means of doping is the interface region of the layers, there is no deterioration in film quality due to the high concentration of dopant.

Figure 6:
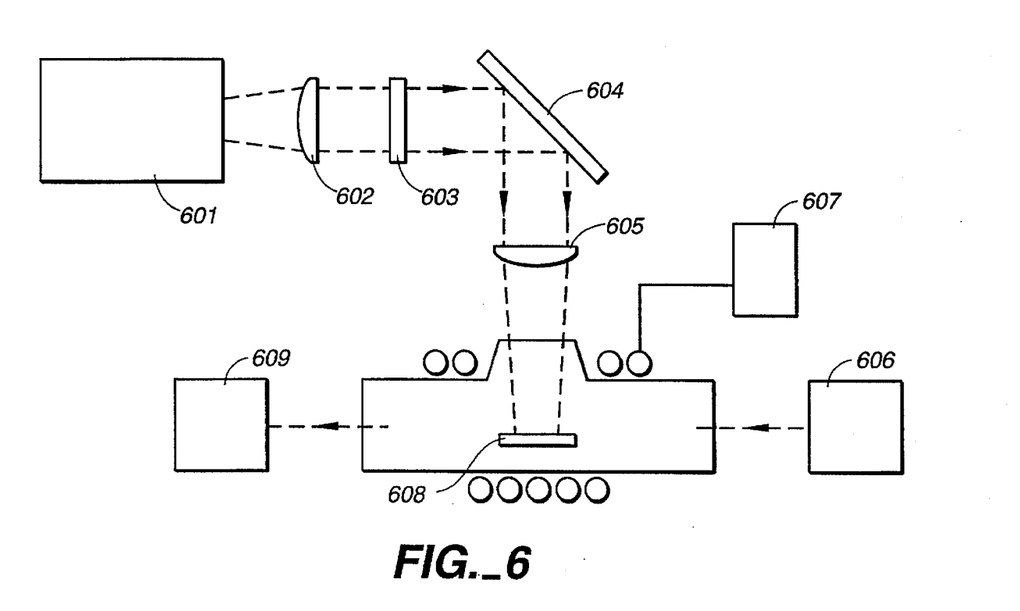
FIG. 6 is a schematic representation of the MOCVD apparatus employed for fabricating the semiconductor laser of this invention.

FIG. 6 shows a block diagram of the major components of the MOCVD apparatus employed in connection with this embodiment of the invention. In this apparatus, the material is put into reaction tube 607 from material introduction system 606 and this gas is permitted to flow onto substrate 608 which is heated by means of RF oscillator 610 growing a compound semiconductor thin film. The used material is discharged through gas exhaust system 609. In addition, the material can be introduce instantaneously to reaction tube 607 by means of a valve that is computer controlled. Moreover, the supplied volume can be controlled to a predetermined volume through a mass flow controller (MFC). Although not employed in this embodiment, this apparatus is also equipped with an excimer laser 601. The ultraviolet light from excimer laser 601 is collimated by means of cylindrical lenses 602 and 603, reflected by a mirror 604 and then passed through condenser lens 606 for projection onto the substrate during the growing process.

[Second Embodiment]

Figure 7:
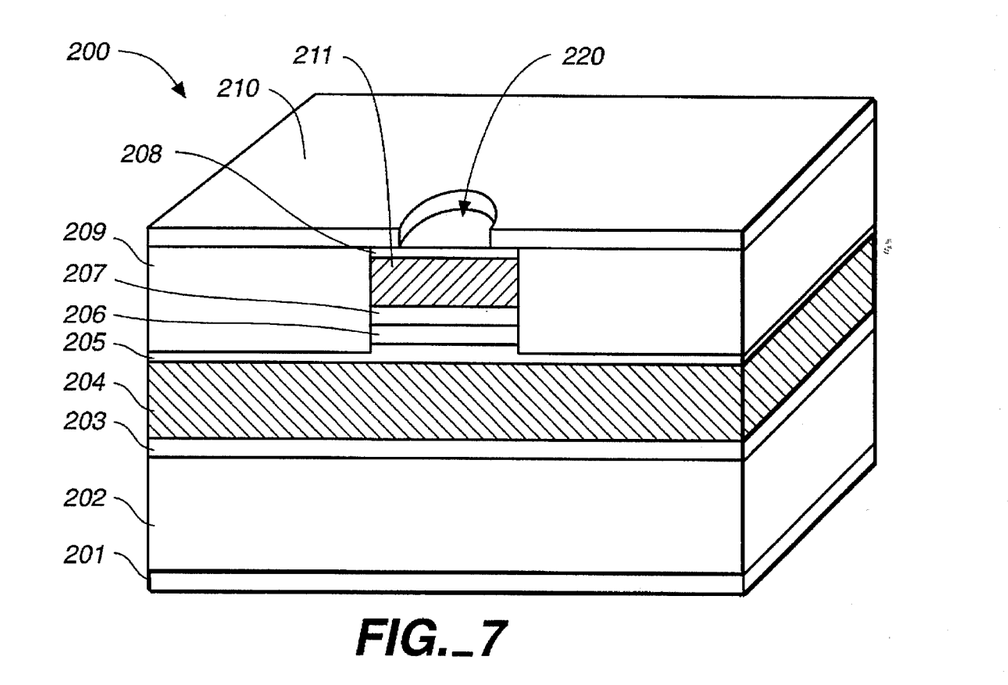
FIG. 7 is a cross sectional perspective view illustrating a second embodiment of a surface emitting semiconductor laser comprising this invention.

FIG. 7 is a cross sectional perspective view of the emitting section of semiconductor laser 200 comprising second embodiment of this invention. FIGS. 8A–8E various cross sectional views of the steps in the manufacturing process of semiconductor laser 200.

Semiconductor laser 200 of the second embodiment differs from that of the laser of the first embodiment, described above, in that the emitting section is, in part, formed in the shape of a column from the p-$Al_{0.1}Ga_{0.9}As$ contact layer 208 to the n-$Al_{0.4}Ga_{0.6}As$ cladding layer 205 and, further, a DBR multiple layer mirror 211 is formed on p-$Al_{0.4}Ga_{0.6}As$ cladding layer 207. The construction and manufacturing process of this embodiment will be described below relative to FIGS. 8A–8E.

Figure 8A:
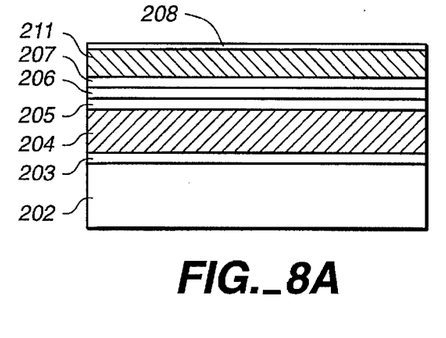
FIGS. 8A–8E show various cross sectional views of the second semiconductor laser embodiment of FIG. 7 illustrating the manufacturing process for the laser.

(1) First, an n-type GaAs buffer layer 203 is formed on an n-GaAs substrate 202. Next, 30 pairs of DBR multiple layer mirrors 204 are formed. These mirrors have a light reflection power of 98% or more relative to a wavelength in a vicinity of 870 nm, which is provided from alternating layers of n-AlAs and an n-$Al_{0.1}Ga_{0.9}As$. Next, an n-$Al_{0.4}Ga_{0.6}As$ cladding layer 205, a p-type GaAs active layer 206 and a p-$Al_{0.4}Ga_{0.6}As$ cladding layer 207 are epitaxially formed in sequence. Next, 25 pairs of DBR multiple layer mirrors 211 are formed. These mirrors have a light reflection power of 94% or more relative to a wavelength in a vicinity of 870 nm, which is provided from alternating layers of p-AlAs and a p-$Al_{0.1}Ga_{0.9}As$. Next, a p-$Al_{0.1}Ga_{0.9}As$ contact layer 208 is grown by means of epitaxial growth employing MOCVD (FIG. 8A). Relative to this embodiment, the growth temperature is 700° C., the growth pressure is 150 Torr, the Group III materials are the organic metals TMGa (tri methyl gallium) and TMAl (tri methyl aluminum), the Group V material is $AsH_3$, the n-type dopant is $H_2Se$, and the p-type dopant is DEZn (diethyl zinc).

In the fabrication of the DBR multiple layer mirrors 204 and 211, the dopant concentration at the interface of the layers is increased by controlling the supply of $H_2Se$ in the case of the DBR multiple layer mirror 204 during the fabrication of this layer and by controlling the supply of DEZn in the case of the DBR multiple layer mirror 211, as in the case of the previously described first embodiment.

Figure 8B:
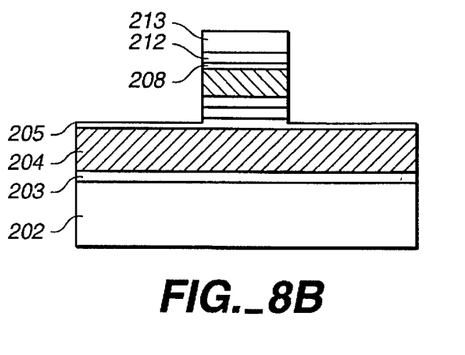

(2) Next, RIBE is employed to provide a columnar shaped emitting section that is covered with photoresist 213 and selective etching is carried out partially into n-$Al_{0.4}Ga_{0.6}As$ cladding layer 205 (FIG. 8B). In this embodiment, a mixed gas of chlorine and argon is employed as the etching gas. The gas pressure is $1\times10^{-3}$ Torr and the extraction voltage is 400 volts.

Figure 8C:
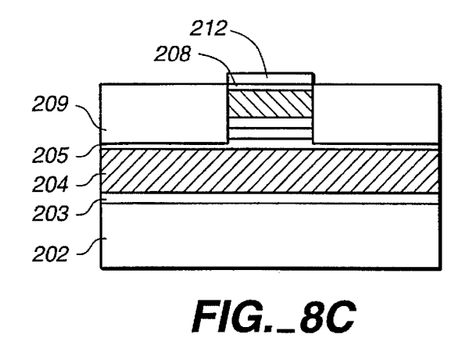

(3) Next, a burying layer will be formed in the etched out region. For this purpose, photoresist 213 is removed and either MBE or MOCVD is employed to bury and grow a $ZnS_{0.06}Se_{0.94}$ layer 209 (FIG. 8C).

Figure 8D:
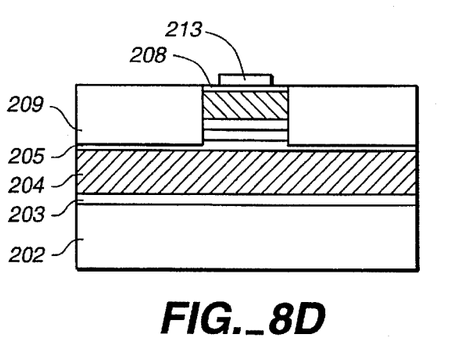

(4) Then, $SiO_2$ layer 212 is then removed. Next, a region that is a little smaller than the diameter of the emitting section will be formed by employing a photoresist on the surface of contact layer 208 (FIG. 8D).

Figure 8E:
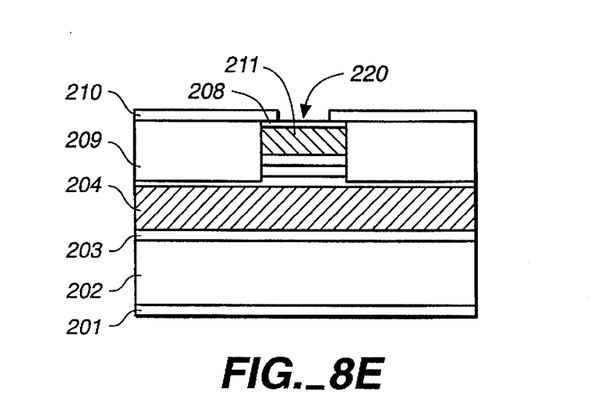

(5) Next, a p-type ohmic electrode 210 is deposited on the surface and the lift-off method is employed to form a light exit aperture in the surface of the emitting section. An n-type ohmic electrode 201 is deposited on the GaAs substrate 202 (FIG. 8E). Finally, electrode alloying is accomplished in a nitrogen atmosphere at 400° C.

As shown in FIG. 7, it is possible to achieve a surface emitting semiconductor laser 200 with a burying structure by means of the process steps set forth above. The $ZnS_{0.06}Se_{0.94}$ layer has a resistance of 1 giga ohm or higher. A very effective current constriction can be achieved because there is no current leakage through burying layer 209. In addition, because burying layer 209 is not required to be of a multiple layer structure, it can be easily grown easily with a high level of repeatability. Furthermore, a $ZnS_{0.06}Se_{0.94}$ layer, which has a substantially smaller refractive index compared to GaAs, provides a more effective light confinement due to the formed buried type, refractive index waveguide structure produced in which active layer 206 is buried.

Moreover, as a result of the increase in the carrier concentration of the interface region of the layers that compose the DBR multiple layer mirrors 204 and 211, the walls of the conduction band are thinner and the tunnel conduction of the electrons is made easy. Further, the valence band is smoother and the holes conduct more easily thereby making it possible to appreciate that the electrical resistance will decrease in the vertical direction of the multiple film layers. Because the interface regions between the mirror layers are the only areas in which the carrier concentration has been increased through increased doping, there is no film quality deterioration due to high concentrations of dopants at these points.

In this embodiment, when the relationship between the amount of doping and the resistance of the DBR multiple layer mirrors was examined, the ratio between the maximum value of the carrier concentration of the interface region and the minimum value of the carrier concentration in regions other than the interface region, the effects of the low resistance began to appear at 1.1 times and continued to about 100 times. However, when increased to over 100 times, the increase in the low resistance effect seen was not much of an enlargement of this ratio. With the view toward making the control of the supply volume easier, the optimum value should have a ratio of from 2 times to 20 times. Also, it was confirmed that the maximum value of the interface region carrier concentration should be at $5\times10^{20}$ $cm^{-3}$ or lower. This was due to the fact that it was confirmed that the film quality would deteriorate if the concentration of Zn was increased higher than this level and that the reflection power of the DBR multiple layer mirrors would also deteriorate.

[Third Embodiment]

Figure 9:
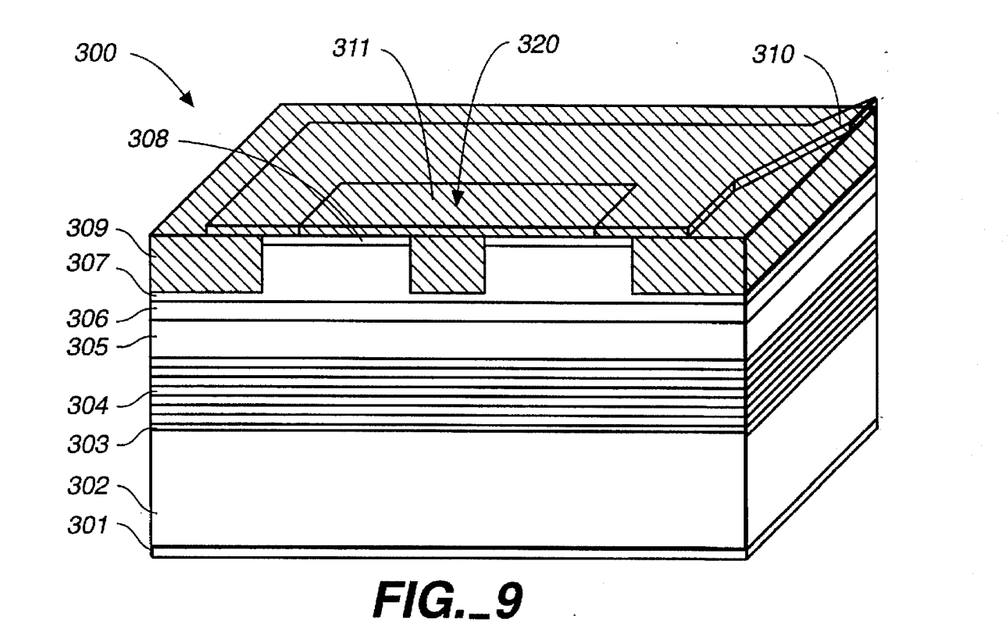
FIG. 9 is a cross sectional perspective view illustrating a third embodiment of a surface emitting semiconductor laser comprising this invention.

FIG. 9 illustrates a cross sectional perspective view of the emitting section of semiconductor laser 300 comprising a third embodiment of this invention. FIGS. 10A–10F various cross sectional views of the steps in the manufacturing process of semiconductor laser 300.

Semiconductor laser 300 differs from that of the first and second embodiments, previously described above, in that p-$Al_{0.5}Ga_{0.5}As$ cladding layer 307 is divided into a plurality of columns that are separated by separation grooves to form the emitting section. The construction and the manufacturing process of this embodiment will be described in connection with FIGS. 10A–10F.

Figure 10A:
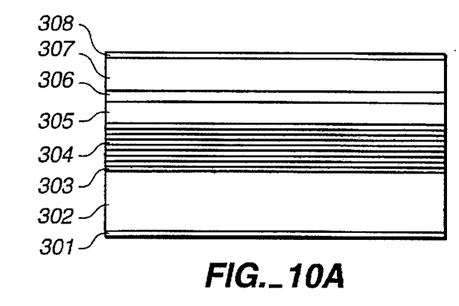
FIGS. 10A–10F show various cross sectional views of the third semiconductor laser embodiment of FIG. 9 illustrating the manufacturing process for the laser.

(1) First, an n-type GaAs buffer layer 303 is formed on an n-type GaAs substrate 302. Next, 25 pairs of semiconductor multiple layer mirrors 304 are formed. These mirrors have a reflection power of 98% or more relative to light with a wavelength in the vicinity of 780 nm, which is provided from alternating layers of n-$Al_{0.9}Ga_{0.1}As$ and n-$Al_{0.2}Ga_{0.8}As$. Next, an n-$Al_{0.5}Ga_{0.5}As$ cladding layer 305, a p-$Al_{0.13}Ga_{0.87}As$ active layer 306, a p-$Al_{0.5}Ga_{0.5}As$ cladding layer 307 and a p-$Al_{0.15}Ga_{0.85}As$ contact layer 308 are epitaxially formed in sequence employing MOCVD (FIG. 10A). In this embodiment, the conditions for epitaxial growth are an epitaxial growth temperature of 720° C. and a pressure of 150 Torr. In addition, the Group III materials are the organic metals TMGa (tri methyl gallium) and TMAl (tri methyl aluminum). The Group V material is $AsH_3$, the n-type dopant is TMSi (tetra methyl silane) and the p-type dopant is DEZn (dimethyl zinc).

Figure 11A:
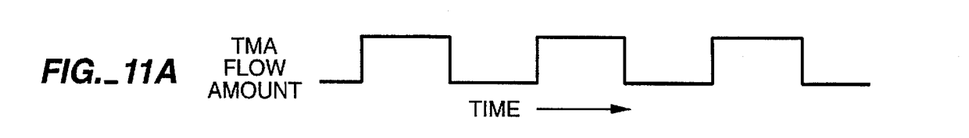
FIGS. 11A and 11B refer to a timing chart illustrating the changes in flow rate of TMAl and the exposure of light when growing the DBR multiple layer mirror of the semiconductor laser of FIG. 9.
Figure 11B:
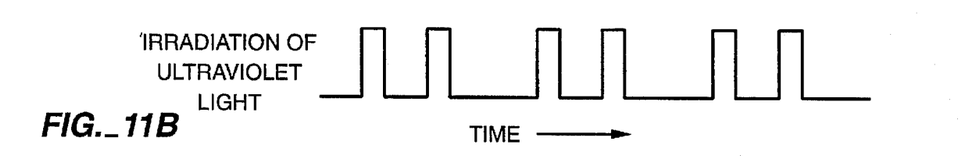

Reference is now made to the manufacturing process steps for DBR multiple layer mirror 304 employing also an exposure light, e.g., ultraviolet light. FIGS. 11A and 11B illustrate the changes in the amount of flow of TMAl and the exposure to light relative to time. TMAl is a base material employed for DBR multiple layer mirror 304. The area with the higher TMAl flow rate forms the n-$Al_{0.9}Ga_{0.1}As$ layer. The area with the lower TMAl flow rate forms the n-$Al_{0.2}Ga_{0.8}As$ layer. Here, the thickness of each layer is controlled so that it is ¼ of the wavelength of the 780 nm wavelength light that propagates through the layer. In addition, the exposure to ultraviolet light takes place at the growth area with the highest TMAl flow rate, i.e., the interface region between n-$Al_{0.1}Ga_{0.8}As$ layers and n-$Al_{0.9}Ga_{0.1}As$ layers.

Figure 10B:
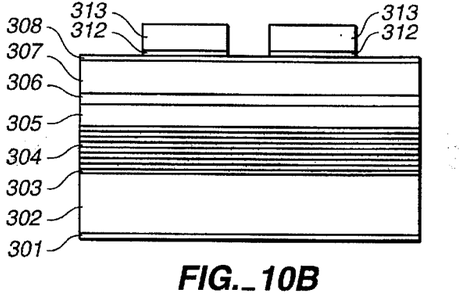

(2) Next, a $SiO_2$ layer 312 is formed on the surface of contact layer 308 employing atmospheric pressure CVD. Photoresist 313 is then applied on top of layer 312 after which a selective pattern is formed employing photolithography. At this time, the pattern conditions are such that the sides of the photoresist pattern are perpendicular to the surface of the substrate. After patterning, any heating is prevented that will cause the sagging of the photoresist layer sides to take place.

(3) Next, this pattern is placed on a mask and reactive ion etching (RIE) is applied employing $CF_4$ gas as the etching gas to remove the $SiO_2$ layer. Performing the operations for the required pattern as described above, it is possible to create photoresist 313 with layer sides that are perpendicular relative to the substrate as well as create a pattern employing the $SiO_2$ layer 312 (FIG. 10B).

Figure 10C:
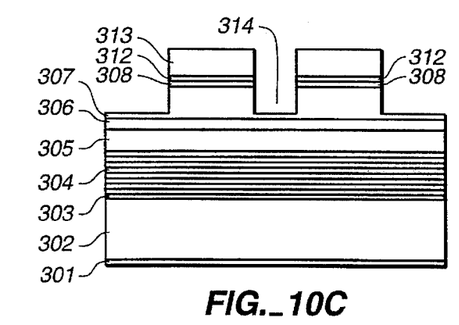

(4) Next, photoresist 313 with the perpendicular sides will be made into a mask and etching will take place to leave a column shaped emitting section employing RIBE. At this time, p-$Al_{0.5}Ga_{0.5}As$ cladding layer 307 will be partially etched to form intervals between a plurality of columns that form the emission section (FIG. 10C). In this embodiment, a mixture of chlorine and argon gasses is employed as the etching gas, the gas pressure is $5\times10^{-4}$ Torr, and the plasma extraction voltage will be 400 volts. Based on sample etching, the ion current density will be 400 µA per square centimeter, with the sample temperature being maintained at 20° C.

Again, the reason p-type $Al_{0.5}Ga_{0.5}As$ cladding layer 307 is only partially etched is to provide the implanted carrier of the horizontal direction of the active layer and provide light confinement by means of a refractive index rib waveguide structure allowing a portion of the light in the active layer enabled in the horizontal direction of the active layer.

In addition, by using a photoresist 313 with perpendicular side surfaces with RIBE as the etching method, which etches by projecting an ion beam that is perpendicular to the etching sample, it is possible to spatially separated emitting sections 320, separated by means of vertical groove 314 on the substrate as well as to fabricate an efficient vertical optical resonator necessary for the improved surface emitting semiconductor laser.

Figure 10D:
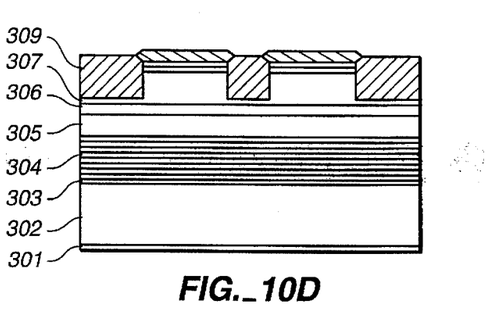

(5) Next, a burying layer is formed on p-$Al_{0.1}Ga_{0.5}As$ cladding layer 307. For this purpose, photoresist 313 is removed and $ZnS_{0.06}Se_{0.94}$ layer 309 is grown by means of MBE or MOCVD (FIG. 10D).

Figure 10E:
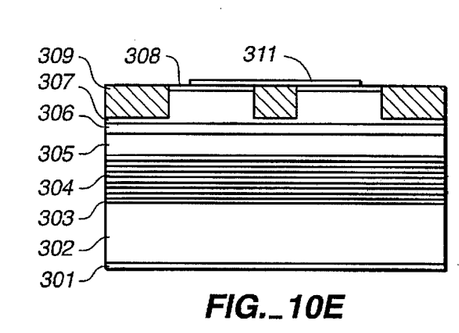

(6) Next, the $SiO_2$ layer and the polycrystalline ZnSSe formed on top of it are removed. Next, four pairs of $SiO_2$/a-Si dielectric multiple layer reflection mirrors 311 are formed on the surface regions of cladding layer 308 employing electron beam deposition. A portion of the mirrors will then be selectively removed by dry etching utilizing RIE so that an area slightly smaller than the diameter of the emitting section remains (FIG. 10E). The reflection power of dielectric multiple layer mirror 311 is 95% or higher at a wavelength of 780 nm.

Because dielectric multiple layer mirrors 311 are also fabricated in the separation grooves 314 that are buried by $ZnS_{0.06}Se_{0.94}$ layer 309 of semiconductor laser 300, a perpendicular resonator structure is formed with constricted regions of the emitting section. As a result, light that leaks through spatial separation grooves contributes to the effectiveness of laser oscillation. Moreover, in phase operation is achieved in emitting section 320.

Figure 10F:
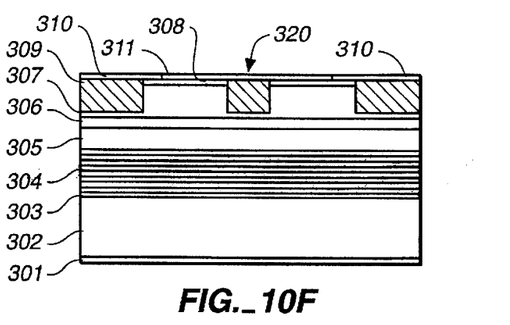

(7) Then, p-type ohmic electrodes 310 are deposited on surfaces other than dielectric multiple layer mirror 311. In addition, an n-type ohmic electrode 301 is deposited on substrate 302 (FIG. 10F). The p-type ohmic electrode 310 on the light exit side is fabricated so that it has continuity with each contact layer 308 of emitting section 320. Finally, alloying of these electrodes takes place in an $N_2$ atmosphere at 400° C.

Thus, as indicated relative to FIG. 9, it is possible to obtain a surface emitting semiconductor laser 300 with an emitting section 320 as described above. The $ZnS_{0.06}Se_{0.94}$ layer 309 has a resistance of one giga ohm or higher. Because there is no leakage of implant current to burying layer 309, an extremely effective current constriction is achieved. In addition, because it is not necessary to make burying layer 309 comprised of multiple layers, this layer can be easily fabricated with a high level of repeatability. Moreover, because this surface emitting semiconductor laser has a rib waveguide structure, there is a large difference in the refractive indices of active layer 306 below $ZnS_{0.06}Se_{0.94}$ layer 309 compared with the active resonator section, thereby concurrently allowing for the accomplishment of effective light confinement.

Because dielectric multiple layer mirrors 311 are also fabricated in the separation grooves 314 that are buried in the $ZnS_{0.06}Se_{0.94}$ layer of the semiconductor laser of this embodiment, a perpendicular resonator structure has also been formed for the constricted areas of the emitting section. As a result, the light that leaks through adjacent separation grooves contributes to the effectiveness of the laser oscillations. Moreover, because leakage light is being utilized, light emitting is synchronized for in phase operation in emitting section 320.

Figure 12A:
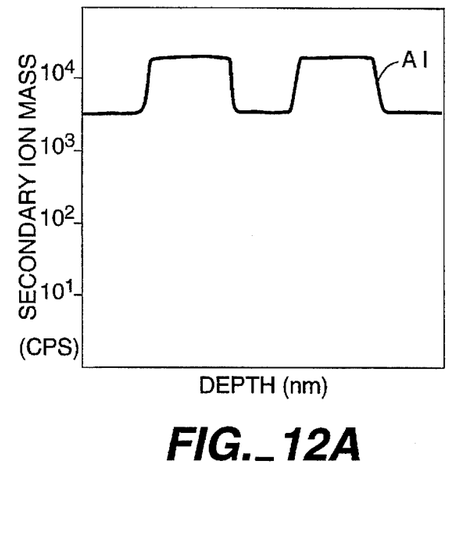
FIGS. 12A and 12B graphically illustrate the results obtained by the use of SIMS for the purposes of evaluating a portion of the distributed reflection multiple layer mirror of the semiconductor laser embodiment of FIG. 9.
Figure 12B:
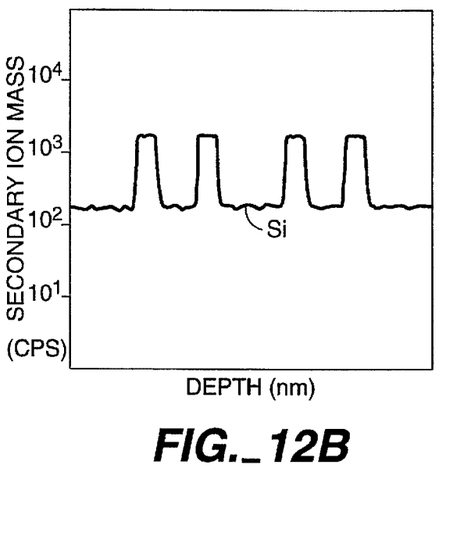

The results of the evaluation of a portion of the DBR multiple layer mirrors employing SIMS are shown in FIGS. 12A and 12B. In these FIGS., the vertical coordinate indicates the number of secondary ions of Al and Si, which correspond to the volume of atoms and number of carriers contained in the layer. The horizontal coordinate indicates the depth of the film thickness direction in part of the distributed reflection multiple layer mirrors. If FIGS. 12A and 12B is compared with FIGS. 11A and 11B, it is obvious that there is a sharp increase in the Si concentration, an n-type dopant, in the layer at the point where ultraviolet light is projected providing a point of high carrier concentration. This is due to the following reasons. TMSi, which is a dopant material, is extremely stable thermally and undergoes thermal breakdown with difficulty. However, because the absorption band is in the ultraviolet region, it breaks down easily by being exposed to ultraviolet light. As a result, when comparing exposure to ultraviolet light to no exposure to ultraviolet light, the Si concentration of the growth layer sharply rises with exposure to ultraviolet light having the practical effect of an increasing in the amount of n-type dopant.

In addition, as a result of the increase in the carrier concentration of the interface region of the layers comprised of DBR multiple layer mirrors 304, the walls of the conduction band become thin and the electrons easily undergo tunnel transfer. Therefore, there is a decrease in the electrical resistance in the vertical direction of these multiple layers. Also, because the only place that has an increase in carrier concentration due to the doping is the interface region and because the light irradiation contributes to the improvement of the film quality, there is no deterioration in film quality due to high dopant concentration.

The MOCVD apparatus employed in this embodiment is the same as that shown in FIG. 6. Ultraviolet light is obtained from excimer laser 601.

In this third embodiment, an example employing tetra methyl silane has been described. However, this invention is not limited to this material. The same effect can be achieved by employing a material in which thermal breakdown is difficult, in which there is absorption in the short wavelength band and in which breakdown is easily achieved employing the short wavelength light. Examples of the type of materials are tetra isobutyl silicon $(C_4H_9)_4Si$, tri isobutyl silicon hydride $(C_2H_5)_3SiH$ and tri ethyl silane $(C_2H_5)_3SiH$. However, tetra methyl silane is preferred because it is easier to handle and its efficiency for optical breakdown.

Although there are some restrictions relative to the dopant materials, the method of this embodiment does not cause any changes in the flow of gas during growth when the amount of dopant is changed. Therefore, an extremely uniform epitaxial layer is obtained improving the properties and the yield of produced laser devices.

[Fourth Embodiment]

Figure 13:
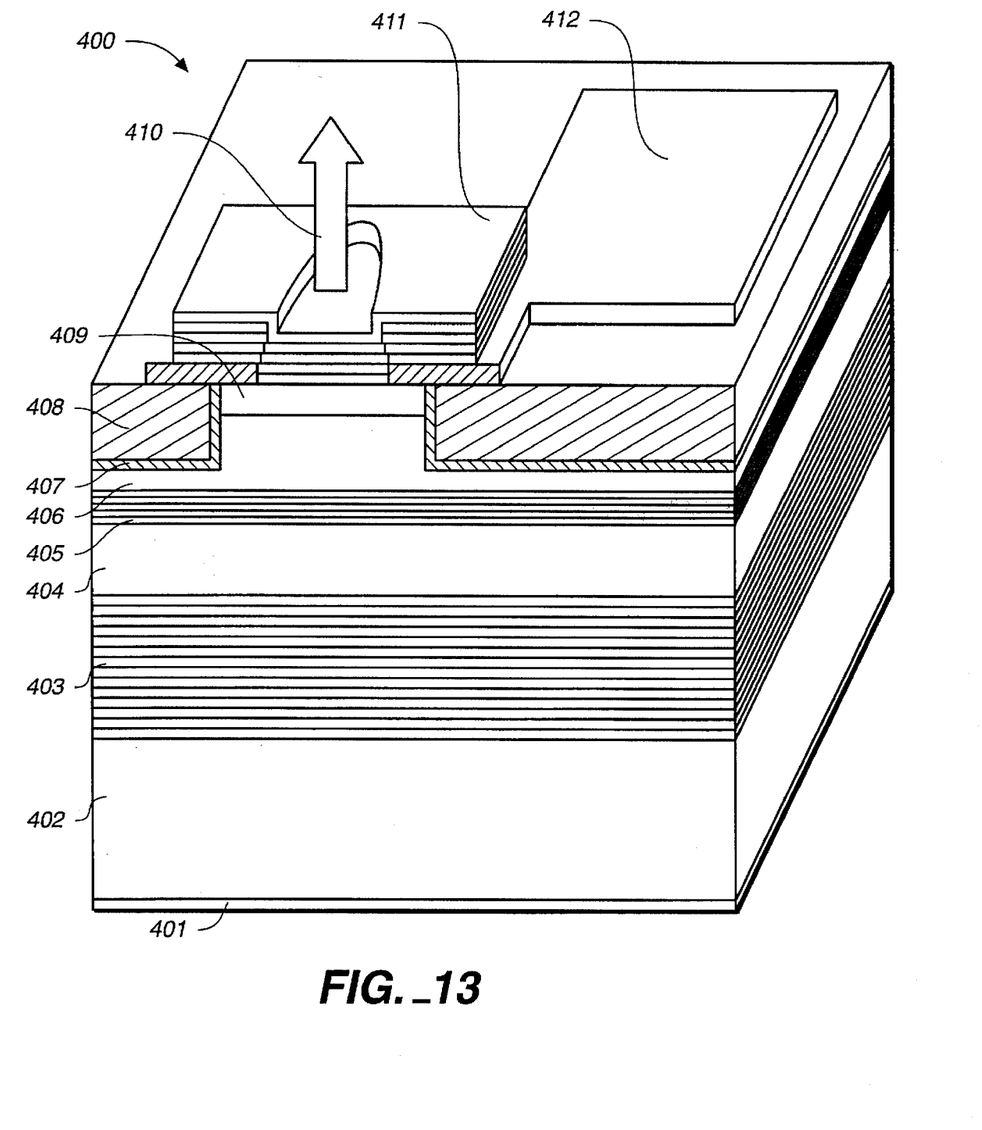
FIG. 13 is a cross sectional perspective view illustrating a fourth embodiment of a surface emitting semiconductor laser comprising this invention.

Reference is now made to the fourth embodiment of this invention shown in FIG. 13, which is a perspective view showing the cross section of a surface emitting semiconductor laser 400. This embodiment differs from previous embodiment relative to the material for the buried layer formed around the periphery of the resonator of the device. In FIG. 13, alternating layers of n-type $Al_{0.8}Ga_{0.2}As$ and $Al_{0.15}Ga_{0.85}As$ are deposited on a n-type GaAs substrate 402 to form a reflecting DBR mirror 403 comprising this multi-layer structure having 99.5% or greater reflectance relative to light having a wavelength equal to about 800 nm. Following the deposition of mirror 403, cladding layer 404 is formed comprising n-type $Al_{0.7}Ga_{0.3}As$, followed by active layer 405 comprising a quantum well structure comprising a well layer of GaAs and a barrier layer of $Al_{0.3}Ga_{0.7}As$ respectively. It is preferred that the film thicknesses, of the well layer is in the range between 40 Å and 120 Å and, at best, is around 61 Å. The film thickness of the barrier layer between the well layers is preferably in the range between 40 Å and 100 Å and, at best, is around 86 Å. Thus, the surface emission type semiconductor laser can be reduced in threshold current with a corresponding increase in light output with improved temperature characteristics and lasing wavelength reproduction.

Following the formation of the quantum well active region, cladding layer 406 comprising p-type $Al_{0.7}Ga_{0.3}As$ is deposited followed by contact layer 409 comprising p+-type $Al_{0.15}Ga_{0.85}As$. Each of these layers are formed by the MOCVD growth process as in the case of the first embodiment. In the fabrication of the DBR mirror 403, the dopant concentration at the interface of the layers is increased by controlling the supply of dopant or by exposure to light.

After formation of all of the foregoing mentioned layers, the multi-layer structure is selectively etched to an intermediate depth within the p-type cladding layer 406 by means of a reactive ion beam etching (RIBE) process. By employing a photoresist pattern, a column-shaped light emitting portion 414 is produced since this region was covered and protected by an overlying photoresist pattern. Thus, column-shaped resonator portion 414 is created having the same cross-section region as the profile of the overlying photoresist layer. The reason why the p-type cladding layer 406 is etched to its intermediate depth will be described later.

A buried layer, comprising the combination of layers 407 and 408, is formed over the exposed p-type cladding layer 406. This buried layer is formed of materials different from those of the previous embodiments. After the photoresist pattern is removed, a combination of layers comprising insulating silicon compound film 407 and flattening layer 408 are formed on cladding layer 406 around resonator 414.

Insulating silicon compound film 407 may be formed of any one of the compounds selected from the group comprising silicon oxides ($SiO_x$), such as, $SiO_2$; silicon nitrides ($SiN_x$), such as $Si_3N_4$; silicon carbides ($SiC_x$), such as SiC; and the like. Film 407 may be formed by one of several processes, such as, normal pressure, thermal CVD, reduced pressure, thermal CVD, plasma CVD, reactive deposition and other similar processes. The process selected is dependent upon the material employed for film 407. For example, in the present embodiment, film 407 is formed from a $SiO_x$ compound, such as $SiO_2$. The $SiO_x$ is formed preferably by normal pressure, thermal CVD having a film thickness in the range between about 500 Å and 2,000 Å. During the fabrication of film 407, the substrate temperature was set at about 450° C. The process gas comprises monosilane ($SiH_4$) with flow rate of 9 sccm, oxygen ($O_2$) with a flow rate of 50 sccm, and a carrier gas of nitrogen ($N_2$) with a flow rate of 5 slm. The growth speed of the $SiO_x$ film was about 12.5 Å/min.

Flattening layer 408 is preferably formed of a material having a growth temperature lower than the growth temperature of insulating silicon compound film 407, such as, SOG (Spin on Glass). Alternatively, flattening layer 408 may be formed of a heat resistant resin, such as a polyimide film. The film thickness of the SOG film may be in the range between 0.5 μm and 1.5 μm while the film thickness of the polyimide film may be in the range between 4 μm and 6 μm. In any event, film 408 may be formed by spin coating and then subsequently baked. The reason why the film thickness of a formed SOG film is smaller than that for a polyimide film is because the SOG film having a greater film thickness tends to crack during the subsequent baking step.

In addition, flattening layer 408 may be formed of a polycrystalline II–VI group compound semiconductor film, such as, ZnSe or an insulating silicon compound film, e.g., $SiO_x$, $SiN_x$, $SiC_x$ or such other known insulating material, which can be formed utilizing a process that requires a lower growth temperature than the growth temperature for the first insulating film 407. For example, if a $SiO_x$ film, such as $SiO_2$, is formed by means of electron beam deposition, flattening insulating film 408 may be formed at a temperature below the process temperature of CVD processing. For example, in the present embodiment, a vitreous solution containing 20% of $SiO_2$, by weight, was applied on a sample to form the SOG film 408 while spinning the sample at 3,000 rpm for about 20 seconds. Next, the substrate sample with the SOG film was baked at 80° C. for about one minute, then at 150° C. for two minutes, and then at 300° C. for about 30 minutes in each case in an atmosphere of $N_2$.

SOG film 408 is then etched back and made uniformly flush with the surface of exposed contact layer 409 by means of reactive ion etching (RIE) processing comprising, for example, a planar dime RIE system having a reactive gas comprising a mixture containing $SF_6$ and Ar in a ratio of 1:1 and a chamber pressure of about 20 mTorr. The etching rate was about 1,000 Å/min.

Since the etching rate for the $SiO_x$ film 407 is lower than that for the flattening film 408, the portion of film 407 atop column-shaped light emitting portion 414 is left unetched or partially unetched. As a result, upon completion of this etchback process, this film portion and edge portions 407A of film 407 are etched back, leaving the surface of flattening film 408 and contact layer 409 flush and contiguous with the surfaces of portions 407A of barrier layer 407. This is accomplished, for example, by employing the same RIE processing with $CHF_3$ utilized as the reactive gas in the etching chamber having an internal pressure of 18 mTorr. The resulting etching rate was about 400 Å/min.

Next, contact electrode 412 is formed with a central contact opening 412A through which is exposed contact layer 409. Then, a dielectric multi-layer mirror 411 is formed over the exposed surface of contact layer 409 and a portion of contact 412. Mirror 411 is formed by depositing alternating layers of an $SiO_x$ layer, such as $SiO_2$, and a $Ta_2O_5$ layer. Instead of $Ta_2O_5$, a film comprising $ZrO_x$, $ZrTiO_x$, or $TiO_x$ may be employed in alternation with the $SiO_x$ layer. Seven such alternating layers may be employed producing a reflecting mirror having a reflectance level of 98.8% or greater with respect to a wavelength of about 800 nm.

As indicated above, mirror 411 is formed to extend beyond opening 412A in order to insure the accuracy of the thickness of the mirror layers deposited on contact layer 409. Moreover, since mirror 411 is insulative in nature so as not conduct contact current, as is the case of a p-type DBR mirror, the resistance level of mirror can be reduced so that the threshold current of the laser can be reduced with improved external differential quantum efficiency.

Lastly, electrode 401 comprising a Ni and Au-Ge alloy is formed on the bottom surface of substrate 402 to complete the structure of surface emission type semiconductor laser 400.

In operation of laser 400, a forward voltage is applied between upper and lower electrodes 412, 401 to inject a current in laser 400 in a direction toward lower electrode 401 and light is produced in multiple quantum well region 405. The generated light is reflected at both n-type DBR mirror 403 and dielectric multi-layer mirror 411 producing an emission beam 410 through contact opening 412A.

The $SiO_x$ film, such as $SiO_2$ film 407 shown in FIG. 13, is formed by means of normal pressure, thermal CVD having a film thickness in the range of 500 Å and 2,000 Å. Flattening, insulating layer 408 is utilized for flattening the surface of the laser element surface prior to deposition of contact 412 and mirror 411.

Beside utilizing a silicon oxide or silicon nitride type material for flattening layer 408, a resin material may also be employed for this layer. Such a resin film is easy to deposit and easy to render uniform or flush with contact layer 409. Such a flattening layer 408 may be made of a heat resistant resin so as to increase the resistance in this area, but tends to produce a residual moisture when deposited. Examples of heat resistant resin for flattening layer 408 is polyimide resin, acrylic ultraviolet-hardened resin, epoxy resin or polyester. A polyimide film is preferred. If such a resin film is placed in direct contact with a semiconductor layer, such as layer 406, voids are created at the interface between the flattening layer and the interfacing semiconductor layer. As a result, the operating characteristics of laser 400 are degraded over time. By forming a barrier film, such as a silicon oxide film 407, between flattening layer 408 and semiconductor film 406, barrier film 407 serves as a protection layer to prevent degradation of the laser element 400.

In the case of forming flattening layer 408 from a polyimide film, the following process. Layer 407 is formed from a $SiO_x$ compound in the manner as previously explained. Then, a polyimide film is formed over barrier layer 407 by means of spin coating the sample at 3,000 rpm for about 20 seconds. The polyimide material may have a viscosity of about 800 cP, and the resulting film thickness may be about 4 μm. Next, the sample with the polyimide film is baked at 90° C. for about 10 minutes and then at 350° C. for 120 minutes, in each case in an atmosphere of $N_2$. The next process is etch back of the polyimide film so that its surface is made flush with the surface of barrier film 407 formed on column-shaped light emitting portion 414. This is accomplished by means of a reactive ion etching (RIE) processing comprising, for example, a planar diode RIE system with a flow rate of 7 sccm of $O_2$ forming an $O_2$ plasma with RF power at 25 W and a chamber pressure of about 24 mTorr. The etching rate is about 1,500 Å/min. The remaining portion of barrier layer 407 atop column-shaped light emitting portion 414 is removed by means of RIE processing with CHFs utilized as the reactive gas (flow rate of 2.5 sccm) in the etching chamber with RF power at 70 W and an internal pressure of 18 mTorr. The resulting etching rate is about 400 Å/min.

In the case of barrier layer 407 formed of $SiN_x$, normal pressure, thermal CVD is utilized to form a film having a thickness in the range between about 500 Å and 2,000 Å. During the fabrication of film 407, the substrate temperature is set at about 300° C. The process gas comprises monosilane ($SiH_4$) with flow rate of 10 sccm and $NH_3$ with a flow rate of 4 sccm with an RF power of 25 W and a chamber pressure at about 0.8 Torr. The growth speed of the $SiN_x$ film is about 100 Å/min.

Although the silicon oxide film 407 may be formed by any one of several processes, such as plasma CVD and reactive deposition, it is preferably formed via the normal pressure, thermal CVD process employing the combination of $SiH_4$, $O_2$ and $N_2$ as the reactive carrier gas. This process provides the advantage of being carried out under normal atmosphere, forming a film under a heavy $O_2$ presence so that the formed $SiO_x$ film is less deficient of oxygen permitting it to become more dense. Moreover, the step coverage for the thickness in the sides of column-like resonator 414 is substantially the same as the thickness over cladding layer 406. In addition, vapor deposition growth does not change the column-like resonator configuration, such as due to meltback, which occurs in other growth processes, such as in liquid phase epitaxy.

The further utility of barrier layer 407, formed between flattening, insulating film 408 and underlying cladding layer 406 as well as multiple quantum well active region 405, is that impurities, e.g., sodium, chlorine, heavy metals, which are usually contained in the subsequently formed insulating film 408 can be prevented from diffusing, such as by heating, into underlying semiconductor layers 406 and 405. Thus, the thickness of film 407 need only be sufficient to prevent the migration of impurities into these underlying layers. Since film 407, comprising silicon oxide, is formed by means of thermal CVD, it is more dense in nature compared to the subsequently formed flattening, insulating layer 408. Thus, the employment of the dual layer structure comprising films 407 and 408 provides for film structure that can be formed at comparatively lower temperatures without the need of forming a thick structure to prevent the deteriorating effects of heat diffusion of impurities into the Group III-V layers. In the circumstances here, it is has been determined that a film thickness of around 500 Å or greater for a silicon compound film 407 will prevent the diffusion of impurities from the deposition of the overlying flattening, insulating layer 408 into the underlying semiconductor layers 405 and 406. On the other hand, the film thickness of silicon compound film 407 may be as much as 2,000 Å, which has the affect of reducing damage to the semiconductor structure due to heat in subsequent processing of the laser structure. In any case, it is realized that the processing temperature to form the buried region may be made lower by forming the buried layer structure to be only a single layer 407 comprising a silicon compound.

It is preferred that the portion of p-type cladding layer 406 formed between buried layer 407 and multiple quantum well active region 405 ideally have a very small thickness or not even be present. However, this is not possible from a processing point of view since etching control is difficult to prevent etching beyond cladding layer 406 into active region 405. Thus, the preferred thickness of cladding layer between active region 405 and barrier layer 407 is in the range between 0 μm and 0.58 μm, and preferably in a range between 0 μm and 0.35 μm. As a result, laser 400 will not have an interface recombination current at portions of these buried layers thereby improving reliability and efficiency of operation of the laser element.

Buried layers 407, 408 in this embodiment may be employed to form grooves for separating the column-like portions from one another as illustrated in the embodiment of FIG. 9. As a result, a plurality of laser beams can be emitted in phased locked operation from a plurality of light emitting regions corresponding to respective column-like portions. Also, buried layers 407, 408 formed in the separate grooves can be made of a material substantially transparent to the wavelength of the emitted laser beams. For example, if these buried layers are formed of $SiO_x$ or $SiN_x$, they will be substantially transparent to the wavelength of the laser beam or beams. Therefore, as in the case of the previous embodiments, laser oscillation can be more effectively performed, not only by the laser beams from the light emitting surface portions of the column-like structures, but also by any leakage of light into the transparent buried layers so that the far field emitted beam provides for a larger light emission spot. Lastly, the light emitting surface portions of the column-like structures can be integrated to be formed in a circle arrangement, or in a circle arrangement with one or more central emitters, or in a square or rectangle arrangement, or in a triangle arrangement, or in a single line, double line or multiple line arrangement.

In each of the embodiments described above, a single manufacturing process has been described relative to particular dopants. However, this invention is not limited to these dopants. In addition, S, Se, Te, Si and Zn, C, Be, Mg and Ca may be effectively employed as dopants. When employing GaAs, dopant materials with low doping efficiency, such as Te or Mg, can have their doping profiles changed to achieve equivalent results to those described in relative to the foregoing embodiments. This is accomplished by controlling the flow of $AsH_3$, which is a Group V material, at the location where the high dopant concentration is desired in order to change the V/III ratio, which is the ratio used with the Group III material.

In all of the embodiments described above, a AlGaAs type surface emitting semiconductor laser was detailed. However, this can also be applied well to other Group III-V surface emitting semiconductor lasers. In particular, the oscillation wavelength of the active layer can be changed by changing the Al composition.

In addition, the burying layer is not limited to a ZnSSe compound layer. An equivalent effect can be obtained with a ZnS—ZnSe superlattice and with other Group II-VI compound semiconductors. For example, the equivalent effects can be achieved with ZnSe or ZnS or CdTe and their compounds, or superlattices of these materials can also be selected for the burying layer. Also, a dual layer can function as a buried layer arrangement which can be deposited at comparatively lower temperatures and provide high resistance properties. This dual layer comprises a combination of a dense silicon compound layer and an easily formed flattening layer comprising an insulating silicon compound or a resin material.

Also, the substrate need not be GaAs. Equivalent results can also be achieved employing other semiconductor substrates, such as, Si and InP or from dielectric substrates, such as, sapphire.

In the embodiments described above, examples of increasing the carrier concentration of the interface region of the layer side with large bandgap that composes the DBR multiple layer mirror were given. However, this invention is not limited to this embodiment as the carrier concentration of the interface region of the layer with the small bandgap may also be increased. Alternatively, the carrier concentration of the interface regions between both the layer with the large bandgap and the small bandgap may be increased.

In particular, when a detailed investigation was made of the distribution of the carrier concentration, the reflection power of the DBR multiple layer film, the resistance characteristics of the vertical direction of the DBR multiple layer film and the DBR multiple layer film crystal, it was necessary to make the thickness of the interface region with the increase in carrier concentration by ⅓ of the thickness of both the layer with the large bandgap and that with the small bandwidth. It was confirmed that the crystalline characteristics would deteriorate if the thickness was made greater than this amount.

Moreover, to achieve low resistance, it is desirable to have an instantaneous change in the volume of high concentration dopant and the volume of low concentration dopant. However, a slight deterioration in crystalline characteristics was seen depending on the doping material. In this case, a sharp change in the amount of dopant volume does not take place, and a mass flow controller is employed to make the doping change linearly or as a quadratic function or as a cubic function, in a time that is within ½ the time required to dope the interface region, the low resistance effect will be reduced slightly. However, the crystal characteristics will be prevented from deterioration.

As described in detail above, a highly efficient highly reliable semiconductor laser can be offered by making it possible to easily and accurately control the concentration of dopant in the interface region of a DBR multiple layer mirror composed of low resistance reflection mirrors.

In addition, using the manufacturing process of this invention, it is possible to easily and accurately control the dopant concentration of the interface region of the DBR multiple layer mirrors. It is also possible to offer a surface emitting semiconductor laser with excellent characteristics and excellent yield properties.

The surface emitting semiconductor laser of this invention is not only applicable for use in printing apparatus, such, as printers and copiers, it is also suitable as a light emitting source for telecommunications equipment, such as, facsimile machines and in laser operated displays.

While the invention has been described in conjunction with several specific embodiments, it is evident to those skilled in the art that many further alternatives, modifications and variations will be apparent in light of the forgoing description. Thus, the invention described herein is intended to embrace all such alternatives, modifications, applications and variations as may fall within the spirit and scope of the appended claims.

What is claimed is:

1. A surface emitting semiconductor laser formed on a semiconductor substrate for emitting a beam in a direction perpendicular to the substrate, comprising:

optical resonator means comprising a pair of spatially disposed reflecting mirrors with a plurality of semiconductor layers between said reflecting mirrors, said semiconductor layers including at least one cladding layer and an active region, a region of said cladding layer formed into at least one column-like portion forming a part of said resonator means, a buried region surrounding said at least one column-like portion, said buried region comprising a first barrier layer and a second flattening layer, an electrode formed in contact with a surface region of said column-like portion and having a light emitting port formed therein, one of said reflecting mirrors comprising a plurality of layers and formed on a portion of said electrode and in said light emitting port.

2. The surface emitting semiconductor laser of claim 1 wherein said first and second layers both comprise a silicon compound.

3. The surface emitting semiconductor laser of claim 1 wherein said first layer comprises a silicon oxide layer or a silicon nitride layer or a silicon carbide layer, and said second layer comprises a SOG film or a resin film or a polycrystalline Group II–VI compound semiconductor film.

4. The surface emitting semiconductor laser of claim 1 wherein said first layer comprises a silicon compound and said second layer is a resin material.

5. The surface emitting semiconductor laser of claim 4 wherein said first layer comprises a silicon oxide layer or a silicon nitride layer or a silicon carbide layer, and said second layer comprises polyimide.

6. The surface emitting semiconductor laser of claim 1 wherein said buried region comprises compound layers covering at least an interface region formed between said buried region and said optical resonator means, a second of said compound layers formed at a temperature below the formation temperature of a first of said compound layers.

7. The surface emitting semiconductor laser of claim 1 wherein said buried region comprises two insulating layers, a first insulating layer formed on said at least one cladding layer and a second insulating layer formed on said first insulating layer, said second insulating layer being uniformly planarized to a surface plane of said at least one column-like portion, said first insulating layer preventing the migration of impurities from said second insulating layer into said semiconductor layers during the formation of said second insulating layer and subsequent deposited layer formation.

8. The surface emitting semiconductor laser of claim 7 wherein said first insulating layer comprises a silicon oxide layer or a silicon nitride layer or a silicon carbide layer, and said second insulating layer comprises a SOG film or a resin film or a polycrystalline Group II–VI compound semiconductor film.

9. The surface emitting semiconductor laser of claim 8 wherein said first insulating layer comprises a $SiO_2$ film, and said second insulating layer comprises a SOG film.

10. The surface emitting semiconductor laser of claim 8 wherein said first insulating layer comprises a $SiO_2$ film, and said second insulating layer comprises a polyimide film.

11. The surface emitting semiconductor laser of claim 7 wherein said second insulating layer is formed at a temperature below the formation temperature of said first insulating layer.

12. The surface emitting semiconductor laser of claim 1 wherein said at least one column-like portion has a cross-sectional configuration which is circular, square, rectangular or polygonal.

13. The surface emitting semiconductor laser of claim 12 wherein said cross-sectional configuration is 10 µm or less.

14. The surface emitting semiconductor laser of claim 1 comprising a plurality of column-like portions comprising said optical resonator means for forming a plurality of light beams, separation grooves for separating said column-like portions from one another and having side walls extending substantially perpendicular to the substrate, said grooves including said buried region.

15. The surface emitting semiconductor laser of claim 14 wherein said buried region is transparent to emission wavelength of said laser beams, and said column-like portions are configured in a rectangular cross-section, said light beams operating in phase locked relation forming a single spot in the far field.

16. The surface emitting semiconductor laser of claim 14 wherein groove widths of said grooves are in the range of about 0.5 µm to 10 µm.

17. The surface emitting semiconductor laser of claim 14 wherein said light beams are individually modulated.

18. A surface emitting semiconductor laser formed on a semiconductor substrate for emitting a beam in a direction perpendicular to the substrate, comprising:

an optical resonator having a pair of reflecting mirrors, at least one semiconductor layer formed between said mirrors and at least one semiconductor layer comprising at least one column, a buried region surrounding said at least one column-like portion, distributive reflection multiple layer mirror at one end of said comprising optical resonator comprising a first layer of a Group III–V compound semiconductor and a second layer of a Group III–V compound semiconductor in which the bandgap is larger than that of the first layer, said first layer and said second layer being alternatively stacked, and said first layer and said second layer comprising Group III–V semiconductors with differing refractive indices, and carrier concentration provided in said first and second layers higher in interface regions between said first layer and said second layer compared to regions of said layers other than said interface regions.

19. The surface emitting semiconductor laser in claim 18 wherein said buried region comprising a first barrier layer and a second flattening layer.

20. The surface emitting semiconductor laser of claim 19 wherein said first and second layers both comprise a silicon compound.

21. The surface emitting semiconductor laser of claim 19 wherein said first layer comprises a silicon oxide layer or a silicon nitride layer or a silicon carbide layer, and said second layer comprises a SOG film or a resin film or a polycrystalline Group II–VI compound semiconductor film.

22. The surface emitting semiconductor laser of claim 19 wherein said first layer comprises a silicon compound and said second layer is a resin material.

23. The surface emitting semiconductor laser of claim 22 wherein said first layer comprises a silicon oxide layer or a silicon nitride layer or a silicon carbide layer, and said second layer comprises polyimide.

24. The surface emitting semiconductor laser of claim 19 wherein said buried region comprises compound layers covering at least an interface region formed between said buried region and said optical resonator means, a second of said compound layers formed at a temperature below the formation temperature of a first of said compound layers.

25. The surface emitting semiconductor laser of claim 19 wherein said buried region comprises two insulating layers, a first insulating layer formed on said at least one cladding layer and a second insulating layer formed on said first insulating layer, said second insulating layer being uniformly planarized to a surface plane of said at least one column-like portion, said first insulating layer preventing the migration of impurities from said second insulating layer into said semiconductor layers during the formation of said second insulating layer and subsequent deposited layer formation.

26. The surface emitting semiconductor laser of claim 25 wherein said first insulating layer comprises a silicon oxide layer or a silicon nitride layer or a silicon carbide layer, and said second insulating layer comprises a SOG film or a resin film or a polycrystalline Group II–VI compound semiconductor film.

27. The surface emitting semiconductor laser of claim 26 wherein said first insulating layer comprises a $SiO_2$ film, and said second insulating layer comprises a SOG film.

28. The surface emitting semiconductor laser of claim 26 wherein said first insulating layer comprises a $SiO_2$ film, and said second insulating layer comprises a polyimide film.

29. The surface emitting semiconductor laser of claim 18 wherein the maximum value of the carrier concentration of said interface regions is $5 \times 10^{20}$ cm$^{-3}$ or less.

30. The surface emitting semiconductor laser of claim 18 wherein a thickness of said interface region is within ⅓ of the sum of the thicknesses of said first layer and second layer.

31. The surface emitting semiconductor laser of claim 18 wherein dopants employed for doping said interface region are S, Se, Te and Si for an n-type region and wherein the dopants employed to dope said interface region are Zn, C, Be, Mg and Ca for a p-type region.

* * * * *